(12) United States Patent
Marin et al.

(10) Patent No.: US 6,501,768 B2
(45) Date of Patent: *Dec. 31, 2002

(54) LOCAL MULTIPOINT DISTRIBUTION SERVICE BASE STATION APPARATUS

(75) Inventors: James Scott Marin, Murphy, TX (US); William K. Myers, McKinney, TX (US); Donald G. Burt, Richardson, TX (US); Michael L. Brobston, Allen, TX (US); Andrew Cilia, Grand Prairie, TX (US)

(73) Assignee: Cisco Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/184,498

(22) Filed: Nov. 2, 1998

(65) Prior Publication Data

US 2002/0003808 A1 Jan. 10, 2002

(Under 37 CFR 1.47)

(51) Int. Cl.[7] .............................. H04B 7/212; H04J 3/06; H04Q 7/20; H04M 1/00
(52) U.S. Cl. ..................... 370/465; 370/347; 370/350; 455/425; 455/446; 455/562
(58) Field of Search ................................. 370/347, 465, 370/348, 350; 455/562, 425, 446, 62, 524, 422, 426, 6.2, 71, 76, 454, 561; 375/219, 344, 308, 281

(56) References Cited

U.S. PATENT DOCUMENTS

| | | | | |
|---|---|---|---|---|
| 4,429,417 A | | 1/1984 | Yool | |
| 5,234,348 A | * | 8/1993 | Konsevich et al. | 439/61 |
| 5,625,627 A | * | 4/1997 | Ishi | 370/347 |
| 5,754,961 A | | 5/1998 | Serizawa et al. | 455/517 |
| 5,790,959 A | * | 8/1998 | Scherer | 455/561 |
| 5,794,119 A | * | 8/1998 | Evans et al. | 455/6.2 |
| 5,809,431 A | * | 9/1998 | Bustamante et al. | 455/562 |
| 5,818,832 A | * | 10/1998 | McCallister | 370/350 |
| 5,844,939 A | * | 12/1998 | Scherer et al. | 375/219 |
| 5,896,473 A | * | 4/1999 | Kaspari | 385/24 |
| 5,924,039 A | * | 7/1999 | Hugenberg et al. | 455/454 |
| 5,949,766 A | | 9/1999 | Ibanez-Meier et al. | |
| 5,980,312 A | * | 11/1999 | Chapman et al. | 439/540.1 |
| 6,006,069 A | * | 12/1999 | Langston | 455/62 |
| 6,047,177 A | * | 4/2000 | Wickman | 455/422 |
| 6,052,582 A | | 4/2000 | Blasing et al. | |
| 6,240,556 B1 | * | 5/2001 | Evans et al. | 725/114 |
| 6,243,427 B1 | * | 6/2001 | Stockton et al. | 375/308 |

FOREIGN PATENT DOCUMENTS

| | | | | |
|---|---|---|---|---|
| WO | WO 96/38786 | 12/1996 | | G06F/9/46 |
| WO | WO 97/29608 | 8/1997 | | H04Q/7/36 |

OTHER PUBLICATIONS

PCT International Search Report in International Application No. PCT/US 99/25657, dated Jun. 13, 2000, 7 pages.

* cited by examiner

Primary Examiner—Wellington Chin
Assistant Examiner—M. Phan
(74) Attorney, Agent, or Firm—Baker Botts L.L.P.

(57) ABSTRACT

A local multipoint distribution service base station apparatus for sending and receiving communication signals to and from subscribers includes a base unit having at least one rack which is adapted to receive at least one subrack. At least one communication signal generating unit is also arranged and configured to be received by the subrack. In addition, a transmitting/receiving unit is operationally connected to the base unit for transmitting and/or receiving the communication signals to and from the subscribers.

50 Claims, 6 Drawing Sheets

LOCAL MULTIPOINT DISTRIBUTION SERVICE BASE STATION APPARATUS

The present invention generally relates to a local multipoint distribution service (LMDS) system or local multipoint communication system (LMCS), and more particularly to the base station architecture of the LMDS system.

The LMDS system provides a "wireless local loop" or the "last mile" link to subscribers for fixed communication services such as video and telephony including data information such as facsimile and computer signals. The LMDS system includes a base station or node for sending and receiving selected communication signals to and from a customer premises equipment (CPE) which is remotely located with the subscribers. In addition to the CPE, the base station is also connected to a video serving office or other distribution centers for video content and to a central office switched telephony network for telephony services. A typical LMDS system consists of several base stations per central office and video serving office, and several thousand CPE sites per base station. In this manner, the LMDS system is a "point-to-multipoint" cellular communication system, the base station being the point, and the CPE sites, the multipoint. The connection between the base station and the subscribers is generally through broadband radio frequency (RF). The bandwidth depends on the spectrum allocation but is generally about 1 GHz. The subscriber equipment or CPE tunes to one or more RF frequency channels within the 1 GHz band to connect to the base station.

It is cost effective to have the capacity of the base station correspond to the demand of the subscribers linked to the base station at a given time. However, it is difficult to predict the number of subscribers who will be linked to the base station, especially when the LMDS system is initially being implemented. Consequently, if the number of subscribers grows unexpectedly from the initially projected number, a conventional base station would not be capable of servicing all the subscribers without an extensive and time consuming reconfiguration of the base station, which is an expensive operation. On the other hand, if the number of subscribers predicted is too high or if a significant number of the subscriptions is canceled, the base station would operate at undercapacity.

Also, the conventional base stations generally include a base unit and a remote unit which are physically partitioned from each other. The remote unit includes an antenna which is located, for example, on a tower or on top of a building, and is connected to the other parts of the remote unit via a long wave-guide. A disadvantage of using a long waveguide is that it is expensive and prone to excessive loss (approximately 15 dB/100 ft). Routing the wave-guide to the top of a building, for example, is also a difficult task.

Accordingly, it is a primary object of the present invention to provide an improved base station for cost effectively implementing an LMDS system.

Another object is to provide an improved base station having a base unit which has a modular configuration to allow operation of both small and large systems.

Still another object is to provide an improved base station having a modular configuration for grouping similar functions into proximately located shelves to minimize cabling and RF signal impairments.

A further object is to provide an improved base station having a remote unit which minimizes the length of the wave-guide between an antenna and the other remote unit electronics.

Yet another object is to provide an improved base station having a remote unit which integrates an antenna and the associated transmitter and receiver into a single assembly.

These and other objects will become apparent upon reading the following detailed description of the present invention, while referring to the attached drawings, in which.

DETAILED DESCRIPTION

The present invention is directed to the architecture of a base station of a local multipoint distribution cellular communication system that can provide telephony/data and video services to residential, business and educational facilities. One of the novel features of the present base station is that the components of the base station are provided in modules according to their functions, so that these modules can be added or removed correspondingly with an increase or a decrease in demand on the base station. Another novel feature of the present invention is that the antenna is integrated into an assembly with the electronics of the transmitting/receiving unit of the base station.

Broadly stated, a local multipoint distribution service base station apparatus for sending and receiving communication signals to and from a plurality of remotely located subscriber equipment includes a base unit having at least one rack, which is configured and adapted to receive at least one subrack. Also, at least one communication signal generating unit is arranged and configured to be received in the subrack. A transmitting/receiving unit is operationally connected to the base unit for transmitting and receiving the communication signals to and from the subscriber equipment.

In another embodiment, a local multipoint distribution service base station apparatus for sending and receiving communication signals to and from subscriber equipment includes a communication signal generating unit for generating the communication signals. A transmitting/receiving unit is operationally connected to the communication signal generating unit and is adapted to transmit/receive the communication signals to and from the subscriber equipment. Also, an antenna unit is operatively connected to the transmitting/receiving unit for directing and receiving the communication signals to and from the subscriber equipment. The antenna unit and the transmitting/receiving unit are arranged and configured into an integrated assembly.

Figure 1:
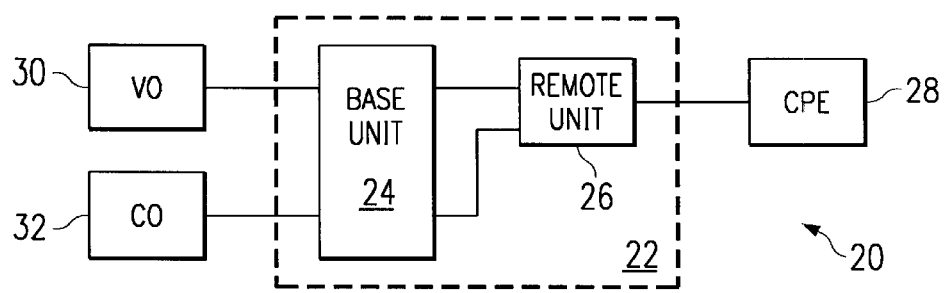
FIG. 1 is a block diagram of a local multipoint distribution service system of this invention.

Turning now to the drawings, and particularly FIG. 1, a block diagram of a local multipoint distribution service (LMDS) system, indicated generally at 20, is shown and generally includes a base station or node 22 having a base unit 24 and a remote unit 26. The remote unit 26 is linked to a customer premises equipment (CPE) 28 which receives video, and/or telephony services from the base station 22. The base unit 24 is connected to a video serving office (VO) 30 or other distribution centers that provide the video content to the base station 22. Also connected to the base unit 24 is a central office (CO) switch 32 which provides the telephony services.

Figure 2:
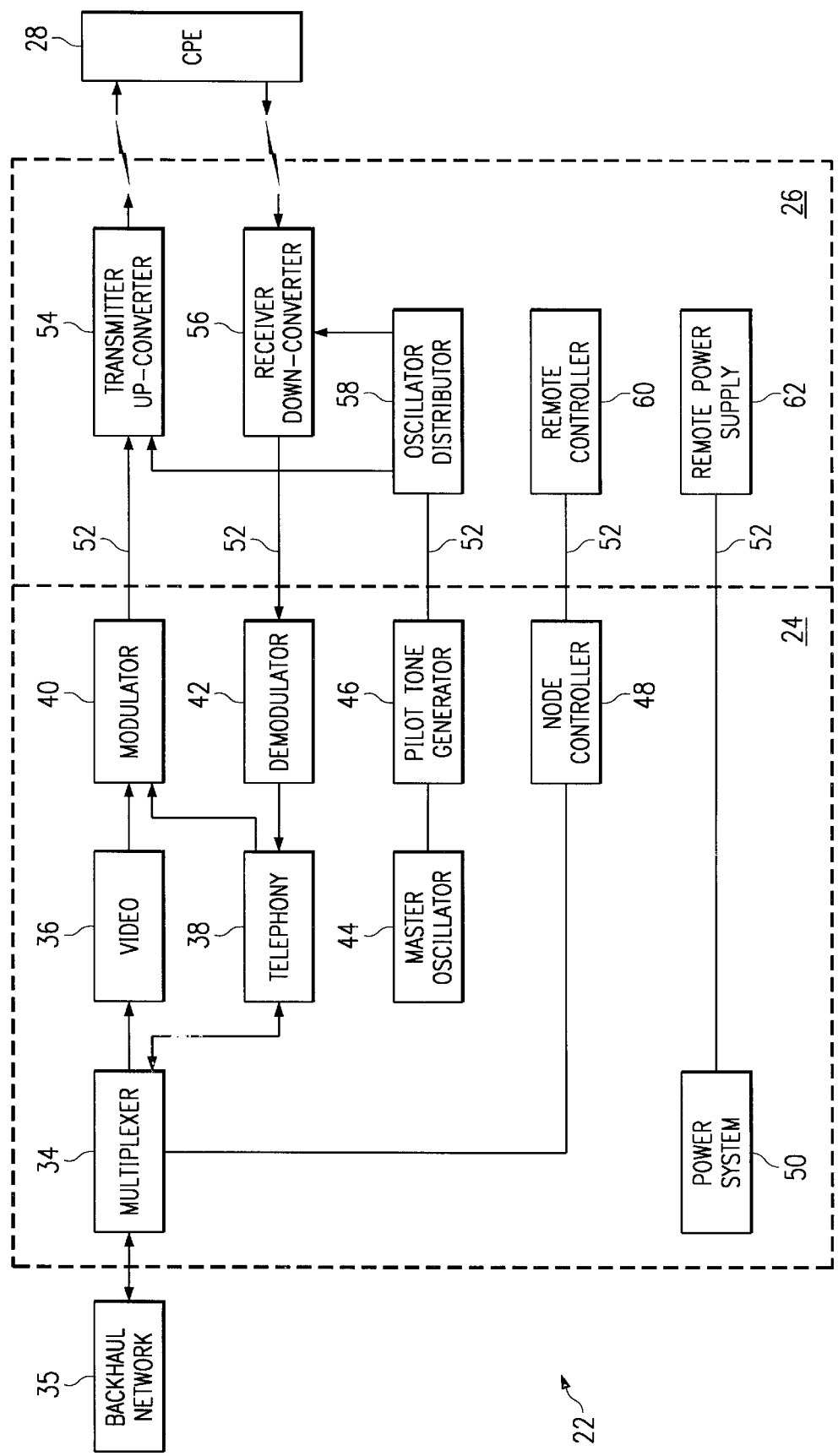
FIG. 2 is a block diagram of a base station embodying the present invention.

Turning now to FIG. 2, the base unit 24 includes a multiplexer 34 which connects the base station 22 to the VO 30 and the CO 32 via a known "backhaul" network 35 such as an OC-x synchronous optical network (SONET) ring or a DS3 network, which are broad bandwidth networks. If the connection is made to a DS3 network, the multiplexer 34 provides the multiplexing from DS3 (44 Mbps) rates to DS1 (1.544 Mbps) rates, and if connected to a SONET network, the multiplexer 34 translates from OC-48 (2,488 Mbps) rates to OC-3 (155 Mbps) rates.

The video signals from the multiplexer 34 are supplied to the video unit 36, which allows the mapping between RF channels, in which the video signals are sent to the subscribers, and the backhaul channels. The RF carriers containing the video channels can be analog or digitally modulated. The telephony signals from the multiplexer 34 are supplied to a telephony unit 38 which performs multiplexing and demultiplexing functions to convert downstream signals (base station to CPE) and upstream signals (CPE to base station) into asymmetric data streams. For downstream transmission, the telephony unit bundles as much traffic as possible into a downstream RF carrier. For example, the industry standard transmission format such as OC-3, DS1 or E1 (2.048 Mbps) is bundled into a high-speed time-division-multiplexed signal (e.g., DS3). In the preferred embodiment, the bundled signal contains 28 T1s, (44.7 Mbps) or 16 E1s for international applications. Additional control bytes are added for forward error correction, radio control, and potentially for encryption.

Thus described feature in which data is sent at an asymmetric rate during the upstream and downstream transmissions is an important aspect of the present invention. High-speed telephony downstream transmission is ideally suited for a point-to-multipoint communication in that the signals are broadcast to all receivers. Each receiver tunes to a designated frequency and time slot; however, each receiver has access to any downstream signals. The receiver demultiplexes the downstream signals to recover only the bit stream of interest. By increasing the downstream data rate, the number of downstream transmitters (or number of RF carriers per transmitter) can be reduced. In addition, every RF channel requires some amount of guard-band to prevent adjacent channel interference. Fewer channels take fewer guard-bands, and therefore, more payload can be sent per a given band. As a result, the spectral efficiency is increased.

Upstream transmission is performed at a lower rate of about 3.3 Mbps, which accommodates both DS1 and E1 payloads, and can be either in continuous format or burst format. The telephony unit 38 is used to reformat the data to a symmetric format for transmission by the multiplexer 34 to the backhaul network 35. Continuous format supports fixed services such as T1 or E1. In burst mode, multiple CPEs 28 can share an RF channel using a time-division multiple access (TDMA) scheme. With the TDMA scheme, the time of transmission of a burst must be timed such that the bursts arrive at the receiving base station 22 at a precise time. Preferably, the burst format consists of a 28 byte pocket in a 2 milli-second frame to support the DS1 telephony frame rate. In this manner, twenty-four subscribers can be accommodated on a single RF channel which provides full rate 64 kbps service to each CPE 28.

Modulators 40 (one shown), which are digital video broadcast (DVB) compliant, for example, connect to the output of the video unit 36 and the telephony unit 38, and modulate the received signals onto a L-band, intermediate frequency signals (950 to 1950 MHZ), and send the modulated signals to the remote unit 26. The digital video and the telephony signals are preferably quadrature phase shift key (QPSK) modulated, which requires less signal-to-noise ratio than most other modulation formats, and therefore provides the longest range. For analog video signals, the invention can be implemented such that the modulators 40 perform frequency modulation (FM). Upstream signals received from the CPE 28 via the remote unit 26 are supplied to demodulators 42 (one shown) which perform a QPSK demodulation and send the signals onto the telephony unit 38.

Another important aspect of the present invention is that a master oscillator 44 provides a single frequency reference which is tracked by all the frequency setting components in the LMDS system 20. Throughout the base unit 24, oscillator signals are frequency division multiplexed onto combiner and distributed networks (not shown) along with payload signals to minimize the need for a separate network to distribute the oscillator signals. In the preferred embodiment, an optional pilot tone generator 46, which is a special oscillator that is frequency locked to the master oscillator 44, is used to lock the oscillators on the remote unit 26 and the CPE 28. It can be located either in the base unit 24, as in the preferred embodiment, or in the remote unit 26, and operates at about 960 MHZ, for example. Alternatively, two optional pilot tone generators 46 and two master oscillators 44 can be employed in the base station 22 for redundant implementation.

A node controller 48 contains a database of all the provisional items (objects) at the base station 22 and the CPE 28, and provides overall control, provisioning and alarm processing functions. A power system 50 is also provided for converting in-country prime power to −48 VDC which is distributed through the base and the remote units 24, 26.

The base unit 24 is connected to the remote unit 26 via a fiber optic link 52 which carries the signals transmitted between the two units 24, 26. The fiber optic link 52 is preferable because it provides better immunity to lighting than copper wires, and allows the remote unit 26 to be located from the base unit 24 by as long as several miles. For example, the remote unit 26 may be placed on a tower or a tall structure such as a building, and the base unit 24 may be located in an equipment room or remotely from the remote unit 26 in an equipment building such as the central office 32. It should be noted that a coaxial cable(s) may also be employed to connect the base unit 24 and the remote unit 26 instead of the fiber optic link 52.

An intermediate frequency (IF) protocol is used to interface the base unit 24 with the remote unit 26 to allow the base unit to be independent of the operating frequency of the remote unit. In this manner, different tower equipment assemblies can be "plugged" into a common base unit 24 to solve the problem of supporting different RF bands. L-band IF is preferred because it is high enough so that frequency conversion to 28 GHz can be accomplished in one translation stage and is low enough such that RF components are readily available and reasonably inexpensive. It is contemplated that wireless point-to-point radio can also be used as the connection between the base unit 24 and the remote unit 26.

The remote unit 26 includes a transmitter/up-converter 54 which is connected to the modulator 40 via the fiber optic link 52 for converting the IF signals from the modulator to RF carrier signals, and sending the converted RF signals to the CPE 28. A receiver/down-converter 56 receives the RF signals from the CPE 28 and converts the RF signals to the IF signals, which is then sent to the demodulator 42 in the base unit 22 via the fiber optic link 52.

Distributed oscillators 58 are included to act as separate milli-meter local oscillators for providing reference signals to each of the transmitter/up-converter 54 and the receiver/down-converter 56 for up and down frequency conversions. The oscillators 58 are connected via the fiber optic link 52 to the optional pilot tone generator 46 which provides the preferred common reference frequency of 960 MHZ. By having a separate oscillator 58 for each of the transmitter/up-converter 54 and the receiver/down-converter 56, a problem of having to have a milli-meter wave distribution network is avoided. The distribution network reduces flexibility because it requires knowing the number of ports and mechanical arrangement of the transmitter/up-converter and the receiver/down-converter 54, 56.

In the preferred embodiment, a remote unit controller 60 is operatively connected to the node controller 48 of the base unit 24 via the fiber optic link 52 and acts as a central control computer that collects alarm information and provides a collection point of the control and communications away from the remote site. It should be noted that the utilization of the remote unit controller 60 in the present invention is optional, and that the functions of the remote unit controller can be performed by the node controller 48. The remote power supply 62 is connected to the power system 50 of the base unit 24 and provides the preferred −48 VDC power needed for transmitting and receiving signals to and from the CPE 28.

Figure 3:
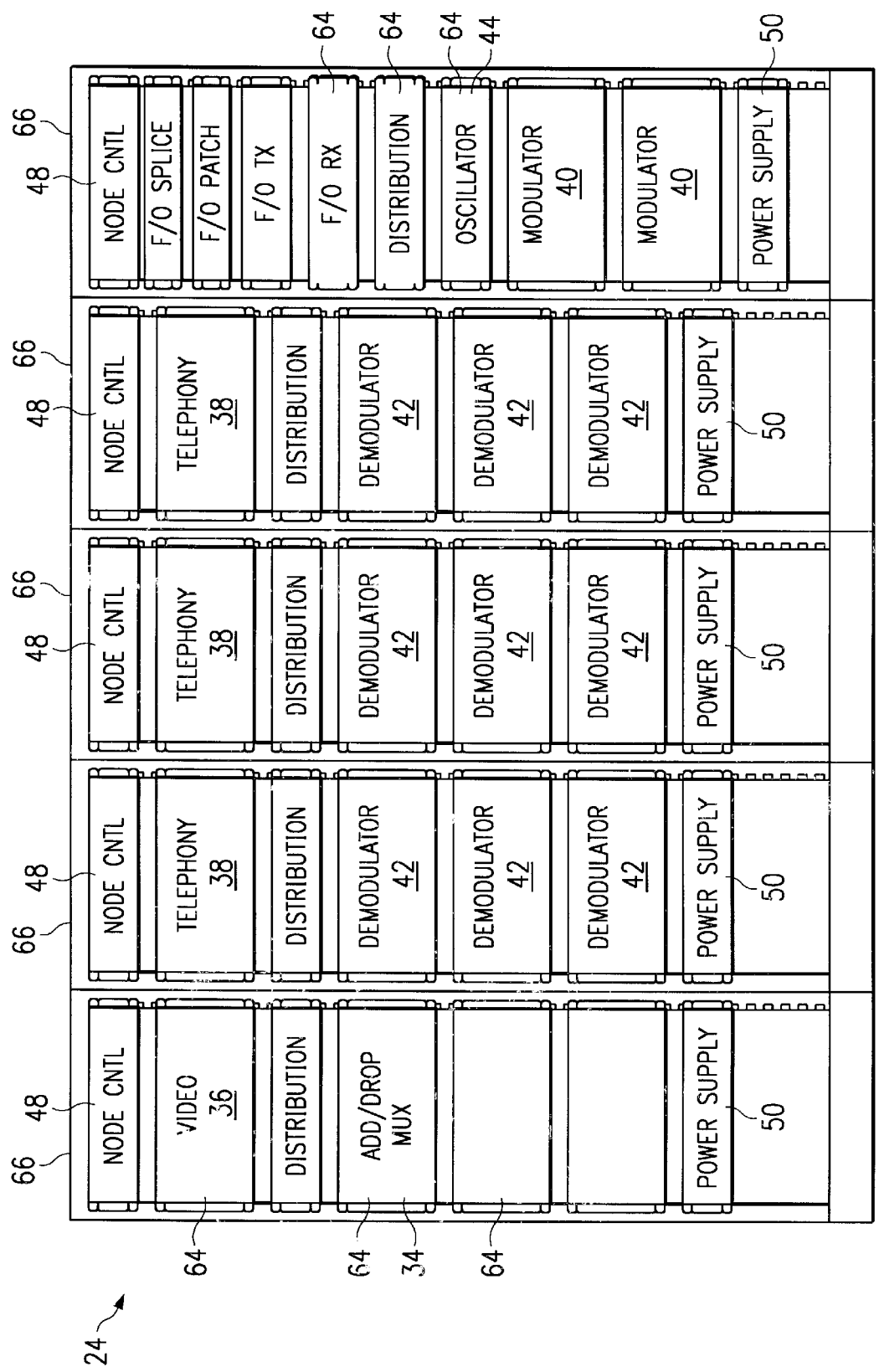
FIG. 3 is a front view of the base unit of FIG. 2.

It is important to note that the base unit 24 may include multiple numbers of each of the components described above, depending on the number of subscribers the base unit is designed to service. Thus, one important feature of the present invention is that the components of the base unit 24 performing the same function are physically grouped together into individual modules. Such modular configuration is shown in FIG. 3, in which the base unit 24 is arranged into a number of subracks or shelves 64 within five racks 66. While the base unit 24 shown in FIG. 3 includes one video unit 36 and three telephony units 38, this is only intended to be an example. The actual number of each of the base unit 24 components is dictated by the subscriber capacity, i.e., subracks 64 and racks 66 can be added to increase capacity and removed to decrease capacity. Increasing and decreasing capacity would only require connecting or disconnecting one or more racks 66 to and from the base station 22. In this manner, the modular configuration of the present invention allows the LMDS system 20 to easily adapt to the needs of the subscribers.

In the preferred embodiment, each of the racks 66 includes one subrack 64 for housing the node controller 48. The network of these node controllers 48 in the base unit 24 provides control of equipment settings such as transmission levels, power up sequencing, fault detection and switching, performing monitoring and remote control from a central network management facility. Communication between the racks 66 is preferably through ethernet, and communication between subracks 64 is preferably through an RS-485 bus for low data rate subracks and a VME bus for high data rate subracks. It is important to note that in the preferred embodiment, the subracks 64 having similar functions are arranged so that they are in close proximity to each other. For example, the node controllers 48 are adjacent each other, the telephony units 38 are also adjacent each other and so are the demodulators 42. This is to minimize cabling and RF signal impairments.

Figure 4:
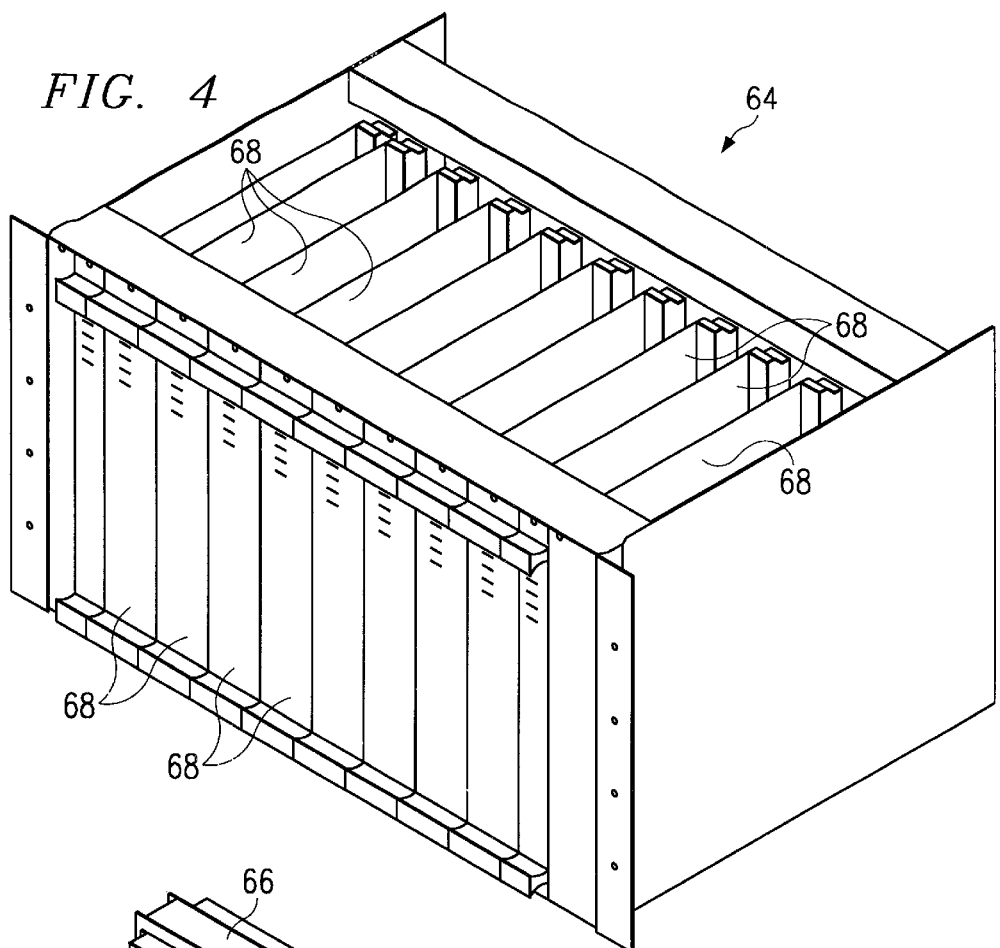
FIG. 4 is a front view one of the racks of FIG. 3.
Figure 5:
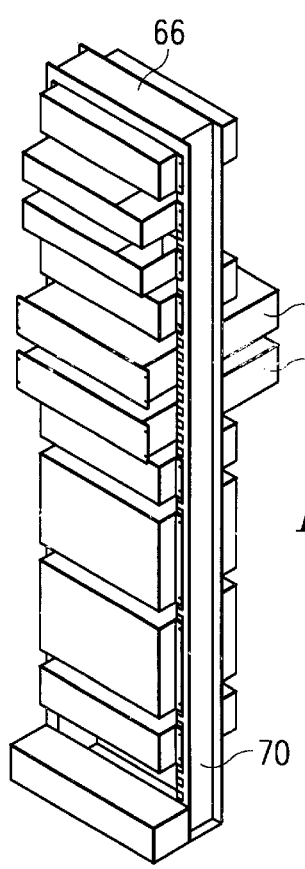
FIG. 5 is a perspective view of one of the racks of FIG. 3.

Turning now to FIG. 4, each of the components in the base unit 24 are integrated onto at least one circuit card assembly (CCA) 68, which are adapted to be received by the subracks 64. The CCAs 68 plug into the subracks 64 and are designated as "line replaceable items," which allow for "live insertion" or "hot swap." Preferably, the connection or "make" of the CCA 68 to the subrack 64 at a connector terminal (not shown) is made in the order of ground, power and signal, and the disconnection or "break" is made in the order of signal, power and ground. The dimensions of the subracks 64, specifically, the height and the depth, vary accordingly to accommodate the size of the CCAs 68. However, the width should be such that the CCAs 68 is able to fit horizontally between a pair vertical sections 70 (best seen in FIG. 5) of the racks 66. The modularity of the CCA 68 allows components of the base unit 24 to be added or removed with capacity, and repairs to be made by merely replacing the faulty CCA.

Figure 6:
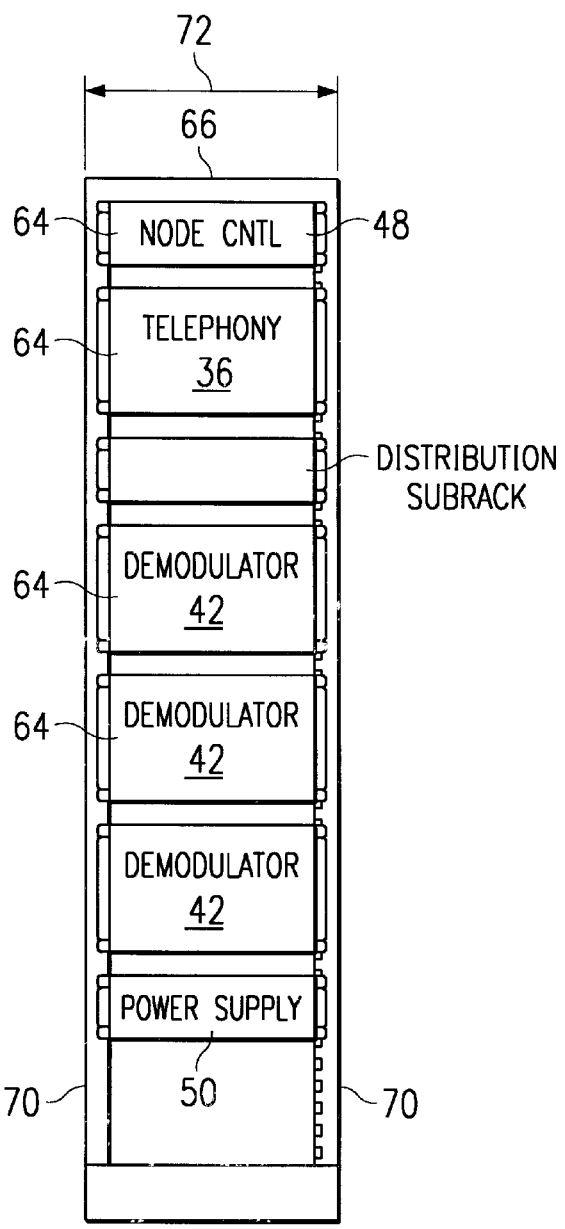
FIG. 6 is a front view of one of the racks of FIG. 3.
Figure 7:
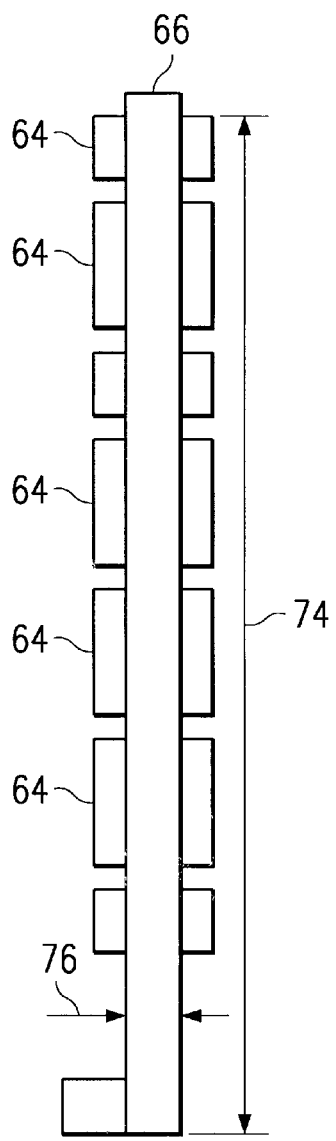
FIG. 7 is a side view of the rack of FIG. 6.

Turning now to FIGS. 6 and 7, one of the racks 66 in FIG. 3 is shown independently, and preferably has a width, as indicated by an arrow 72, of approximately 20 inches, a height, as indicated by an arrow 74, of approximately 84 inches and a depth, as indicated by an arrow 76, of approximately 6 inches. It should be noted that the size of the racks 66 may be varied as necessary to desired dimensions.

Figure 8:
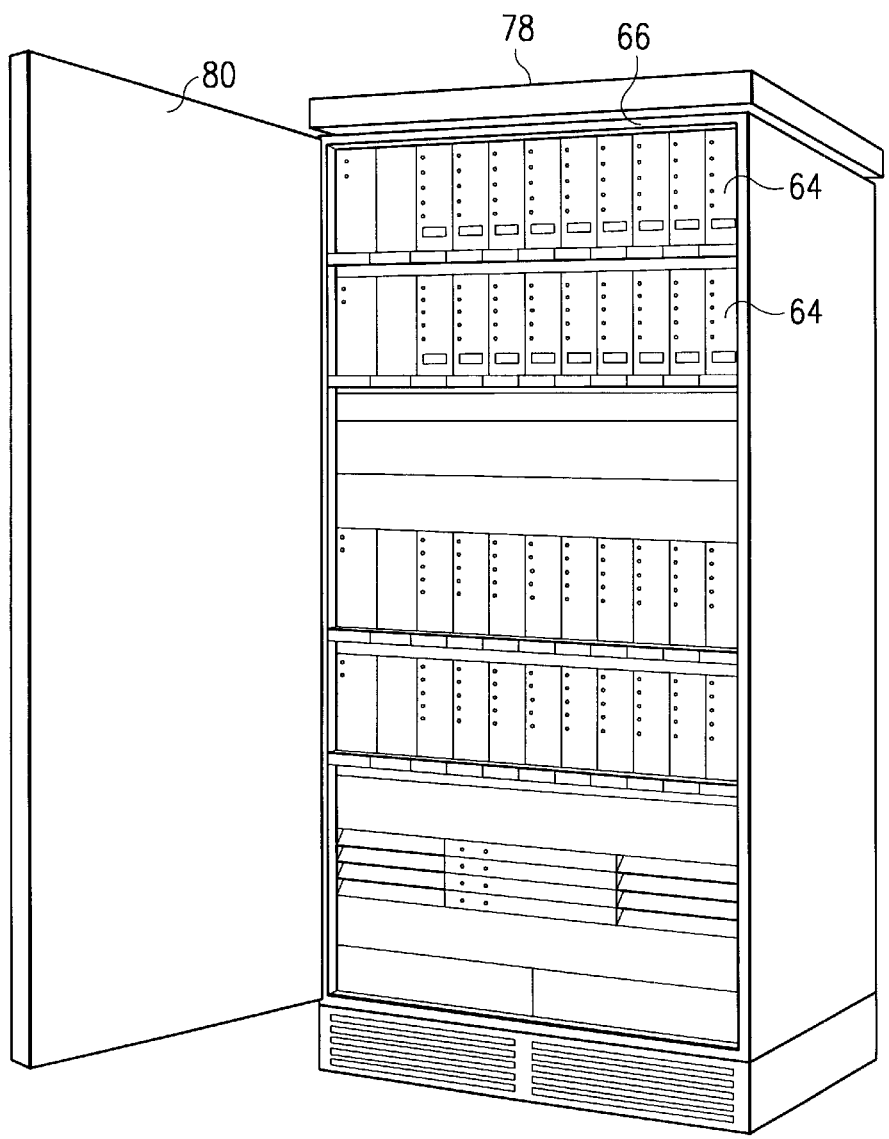
FIG. 8 is a perspective view of a rack enclosed in a housing.

Turning to FIG. 8, the racks 66 and their subracks 64 are preferably filly encased in a housing 78 having an access door 80 in order to meet the conducted and radiated emissions requirement. An open frame racks 66 may also be utilized, provided that the individual CCAs 68 within the subracks 64 are adequately shielded.

Figure 10:
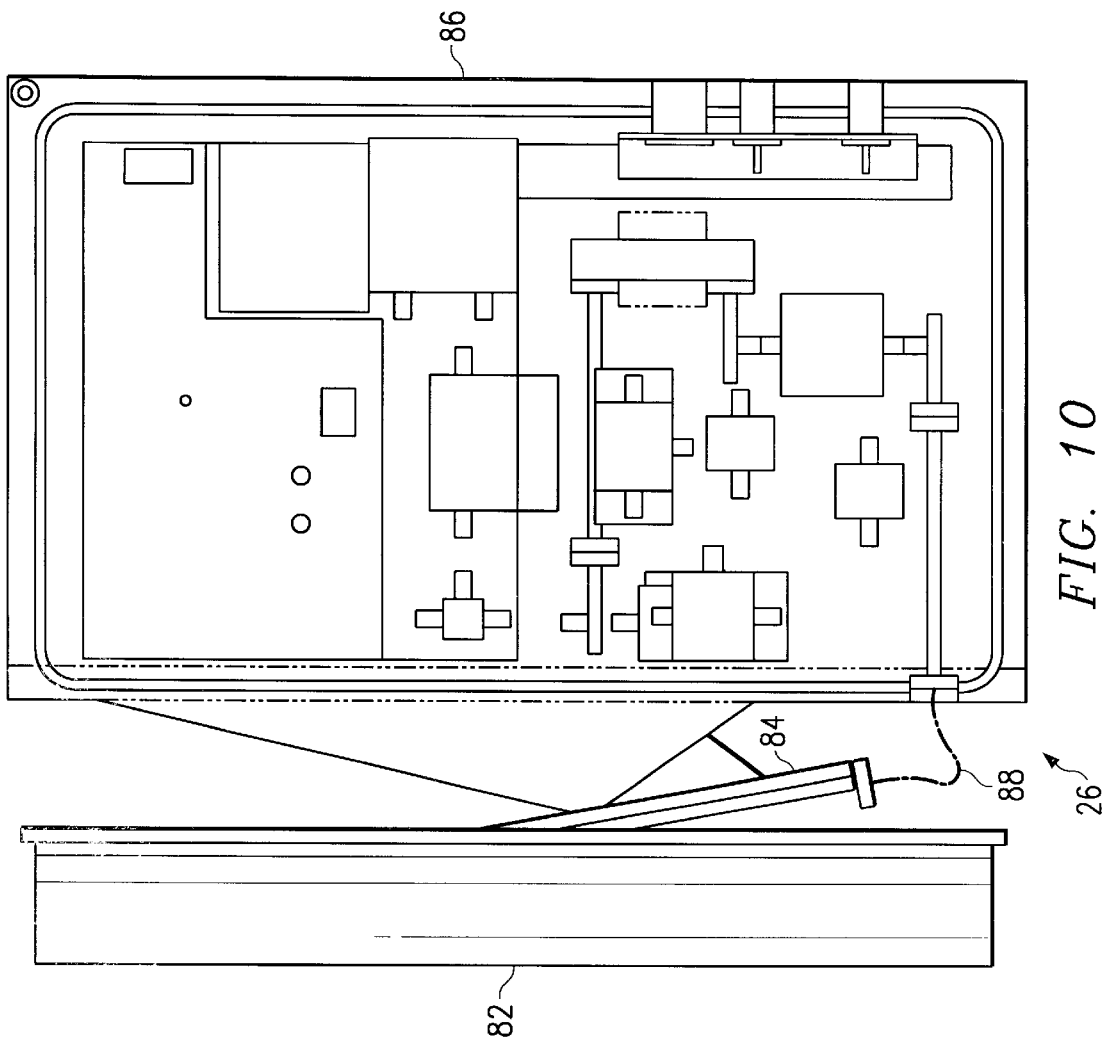
FIG. 10 is a side view of the remote unit of FIG. 9, with the cover removed.
Figure 9:
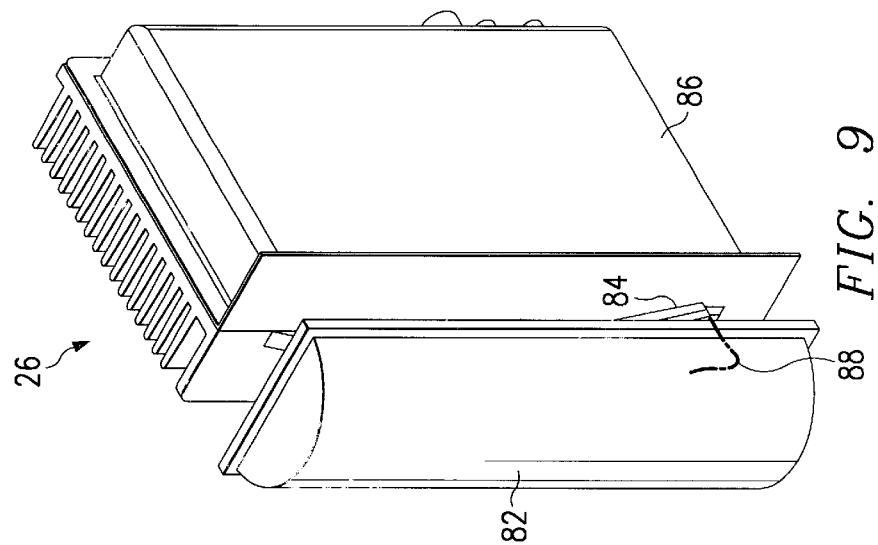
FIG. 9 is a perspective view of a remote unit embodying the present invention.

Turning now to FIGS. 9 and 10, the remote unit 26 is shown to include a radome/polarizer 82, an antenna 84 and an electronic housing 86. An important feature of the present invention is that these components are integrated into a single assembly, with a wave-guide 88 (best shown in FIG. 10, which is a side view the remote unit with cover of the housing 86 removed) connecting the antenna 84 with the components within the electronic housing 86. This arrangement significantly reduces the length of the wave-guide 88, so that the signal loss inherently associated with the wave-guide is minimized.

From the foregoing detailed description, it should be understood that a LMDS base station apparatus for sending and receiving telephony and video signals to and from multitude of subscribers has been shown which has many advantages and desirable attributes. Of particular advantage is the ability to add capacity in a modular fashion by organizing the various functions of the base station into subracks or shelves. Another advantage is that the antenna and the associated electronics are integrated into a single housing, thereby reducing the length of the connection between the antenna and the other components.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. Local multipoint distribution service base station apparatus for sending and receiving communication signals to and from a plurality of remotely located subscriber equipment, comprising:
   a base unit including at least one rack, said rack configured to receive a plurality of subracks;
   a plurality of communication signal generators arranged and configured to be received by each of said plurality of subracks, wherein each of said plurality of communication signal generators is implemented as a replaceable module each with a different functionality and a different physical structure, the replaceable modules being grouped together according to their respective functionalities, the replaceable modules operable to be removed and installed according to a desired subscriber capacity;
   a transmitting/receiving unit operationally connected to said base unit for transmitting and receiving the communication signals to and from the subscriber equipment.

2. A base station apparatus as defined in claim 1 wherein said plurality of said subracks which have received said plurality of said communication signal generators are arranged adjacent to each other in said at least one rack.

3. A base station apparatus as defined in claim 1 wherein each of said plurality of communication signal generators is provided on at least one circuit card, and each of said plurality of subracks is configured to receive said at least one circuit card.

4. A base station apparatus as defined in claim 1 wherein said base unit is connected to a communication signal source for supplying the communication signals to said base unit.

5. A base station apparatus as defined in claim 4 wherein said base unit is configured to send the communication signals from said communication signal source to the subscriber equipment at a higher data rate than a data rate of the communication signals received from the subscriber equipment.

6. Local multipoint distribution service base station apparatus for sending and receiving communication signals to and from a plurality of remotely located subscriber equipment, comprising:
   a base unit including at least one rack, said rack configured to receive a plurality of subracks;
   a plurality of communication signal generators arranged and configured to be received by each of said plurality of subracks, wherein each of said plurality of communication signal generators is implemented as a replaceable module each with a different functionality and a different physical structure, the replaceable modules being grouped together according to their respective functionalities, the replaceable modules operable to be removed and installed according to a desired subscriber capacity;
   a transmitting/receiving unit operationally connected to said base unit for transmitting and receiving the communication signals to and from the subscriber equipment;
   wherein said base unit is connected to a communication signal source for supplying the communication signals to said base unit;
   wherein said base unit is configured to send the communication signals from said communication signal source to the subscriber equipment at a higher data rate than a data rate of the communication signals received from the subscriber equipment;
   wherein said base unit converts a data rate of the communication signals received from said communication signal source to a lower data rate, and performs a multiplexing function on the communication signals to send the communication signals at said higher data rate than said data rate of the communication signals received from the subscriber equipment.

7. A base station apparatus as defined in claim 6 wherein said base unit includes a multiplexer for converting said data rate of the communication signals received from said communication signal source to said lower data rate.

8. A base station apparatus as defined in claim 6 wherein said multiplexing function is performed by at least one of said plurality of communication signal generators.

9. A base station apparatus as defined in claim 4 wherein said base unit is connected to said communication signal source via a broad bandwidth connection network.

10. A base station apparatus as defined in claim 1 wherein said plurality of communication signal generators include a video signal generator and a telephony signal generator, and the communication signals include video signals and telephony signals.

11. A base station apparatus as defined in claim 10 wherein said base unit includes a plurality of said video signal generators and a plurality of said telephony signal generators, said plurality of said video signal generators and said telephony signal generators being received in said plurality of said subracks.

12. A base station apparatus as defined in claim 11 wherein said subracks in which said plurality of said video signal generators have been received are arranged adjacent to each other in said at least one rack, and said subracks in which said plurality of said telephony signal generators have been received are arranged adjacent to each other in said at least one rack.

13. A base station apparatus as defined in claim 11 wherein each of said plurality of said video signal generators and said telephony signal generators is provided on at least one circuit card, and said circuit card is configured to be received in said plurality of subracks.

14. A base station apparatus as defined in claim 10 wherein said telephony signal generator generates data signals.

15. A base station apparatus as defined in claim 10 wherein said base unit is connected to a video signal source and a telephony signal source for supplying said video signals and said telephony signals, respectively, to said base unit.

16. A base station apparatus as defined in claim 15 wherein said base unit is configured to send said video and said telephony signals from said video and said telephony signal sources to the subscriber equipment at a higher data rate than a data rate of said video and said telephony signals received from the subscriber equipment.

17. Local multipoint distribution service base station apparatus for sending and receiving communication signals to and from a plurality of remotely located subscriber equipment, comprising:
   a base unit including at least one rack, said rack configured to receive a plurality of subracks;
   a plurality of communication signal generators arranged and configured to be received by each of said plurality of subracks, wherein each of said plurality of communication signal generators is implemented as a replaceable module each with a different functionality and a different physical structure, the replaceable modules being grouped together according to their respective functionalities, the replaceable modules operable to be removed and installed according to a desired subscriber capacity;

a transmitting/receiving unit operationally connected to said base unit for transmitting and receiving the communication signals to and from the subscriber equipment;

wherein said plurality of communication signal generators include a video signal generator and a telephony signal generator, and the communication signals include video signals and telephony signals;

wherein said base unit is connected to a video signal source and a telephony signal source for supplying said video signals and said telephony signals, respectively, to said base unit;

wherein said base unit is configured to send said video and said telephony signals from said video and said telephony signal sources to the subscriber equipment at a higher data rate than a data rate of said video and said telephony signals received from the subscriber equipment;

wherein said base unit converts a data rate of said video and said telephony signals received from said video and said telephony signal sources to a lower data rate, and performs a multiplexing function on said video and said telephony signals to send said video and said telephony signals at said higher data rate than said data rate of said video and said telephony signals received from the subscriber equipment.

18. A base station apparatus as defined in claim 17 wherein said base unit includes a multiplexer for converting said data rate of said video and said telephony signals received from said video and said telephony signal sources to said lower data rate.

19. A base station apparatus as defined in claim 18 wherein said multiplexing function is performed by said video signal generator and said telephony signal generator.

20. A base station apparatus as defined in claim 15 wherein said base unit is connected to said video and said telephony signal sources via a broad bandwidth connection network.

21. A base station apparatus as defined in claim 1 wherein said plurality of communication signal generators includes a telephony signal generator and the communication signals are telephony signals.

22. A base station apparatus as defined in claim 21 wherein said base unit includes a plurality of said telephony signal generators and a plurality of said subracks, and said plurality of said telephony signal generators are received in said plurality of subracks.

23. A base station apparatus as defined in claim 22 wherein said subracks in which said plurality of said telephony signal generators have been received are arranged adjacent to each other in said at least one rack.

24. A base station apparatus as defined in claim 22 wherein each of said plurality of said telephony signal generators is provided on at least one circuit card, and said circuit card is configured to be received in said plurality of subracks.

25. A base station apparatus as defined in claim 21 wherein said telephony signal generator generates data signals.

26. A base station apparatus as defined in claim 21 wherein said base unit is connected to a telephony signal source for supplying said telephone signals to said base unit.

27. A base station apparatus as defined in claim 26 wherein said base unit is configured to send said telephony signals from said telephony signal source to the subscriber equipment at a higher data rate than a data rate of said telephony signals received from the subscriber equipment.

28. Local multipoint distribution service base station apparatus for sending and receiving communication signals to and from a plurality of remotely located subscriber equipment, comprising:

a base unit including at least one rack, said rack configured to receive a plurality of subracks;

a plurality of communication signal generators arranged and configured to be received by each of said plurality of subracks, wherein each of said plurality of communication signal generators is implemented as a replaceable module each with a different functionality and a different physical structure, the replaceable modules being grouped together according to their respective functionalities, the replaceable modules operable to be removed and installed according to a desired subscriber capacity;

a transmitting/receiving unit operationally connected to said base unit for transmitting and receiving the communication signals to and from the subscriber equipment;

wherein said plurality of communication signal generators include a telephony signal generator and the communication signals are telephony signals;

wherein said base unit is connected to a telephony signal source for supplying said telephone signals to said base unit;

wherein said base unit is configured to send said telephony signals from said telephony signal source to the subscriber equipment at a higher data rate than a data rate of said telephony signals received from the subscriber equipment;

wherein said base unit converts a data rate of said telephony signals received from said telephony signal source to a lower data rate, and performs a multiplexing function on said telephony signals to send said telephony signals at said higher data rate than said data rate of said telephony signals received from the subscriber equipment.

29. A base station apparatus as defined in claim 28 wherein said base unit includes a multiplexer for converting said data rate of said telephony signals received from said telephony signal source to said lower data rate.

30. A base station apparatus as defined in claim 29 wherein said multiplexing function is performed by said telephony signal generator.

31. A base station apparatus as defined in claim 1 wherein said plurality of communication signal generators include a video signal generator, and the communication signals are video signals.

32. A base station apparatus as defined in claim 31 wherein said base unit includes a plurality of said video signal generators, and said plurality of said video signal generators are received in said plurality of subracks.

33. A base station apparatus as defined in claim 32 wherein said subracks in which said plurality of said video signal generators have been received are arranged adjacent to each other in said at least one rack.

34. A base station apparatus as defined in claim 32 wherein each of said plurality of said video signal generators is provided on at least one circuit card, and said circuit card is configured to be received in said plurality of subracks.

35. A base station apparatus as defined in claim 31 wherein said base unit is connected to a video signal source for supplying said video signals to said base unit.

36. A base station apparatus as defined in claim 35 wherein said base unit is configured to send said video signals from said video signal source to the subscriber equipment at a higher data rate than a data rate of said video signals received from the subscriber equipment.

37. Local multipoint distribution service base station apparatus for sending and receiving communication signals to and from a plurality of remotely located subscriber equipment, comprising:

a base unit including at least one rack, said rack configured to receive a plurality of subracks;

a plurality of communication signal generators arranged and configured to be received by each of said plurality of subracks, wherein each of said plurality of communication signal generators is implemented as a replaceable module each with a different functionality and a different physical structure, the replaceable modules being grouped together according to their respective functionalities, the replaceable modules operable to be removed and installed according to a desired subscriber capacity;

a transmitting/receiving unit operationally connected to said base unit for transmitting and receiving the communication signals to and from the subscriber equipment;

wherein said plurality of communication signal generators include a video signal generator, and the communication signals are video signals;

wherein said base unit is connected to a video signal source for supplying said video signals to said base unit;

wherein said base unit is configured to send said video signals from said video signal source to the subscriber equipment at a higher data rate than a data rate of said video signals received from the subscriber equipment;

wherein said base unit converts a data rate of said video signals received from said video signal source to a lower data rate, and performs a multiplexing function on said video signals to send said video signals at said higher data rate than said data rate of said video signals received from the subscriber equipment.

38. A base station apparatus as defined in claim 37 wherein said base unit includes a multiplexer for converting said data rate of said video signals received from said video signal source to said lower data rate.

39. A base station apparatus as defined in claim 38 wherein said multiplexing function is performed by said video signal generator.

40. A base station apparatus as defined in claim 1 wherein said base unit further comprises:

at least one modulator connected between said communication signal generators and said transmitting/receiving unit for modulating the communication signals; and at least one demodulator connected between said communication signal generators and said transmitting/receiving unit for demodulating the communication signals received from the subscriber equipment.

41. A base station apparatus as defined in claim 1 wherein said base unit further comprises a master oscillator for providing a single frequency reference for all frequency setting components of said base station apparatus.

42. A base station apparatus as defined in claim 41 wherein said base unit further comprises a pilot tone generator operationally connected to said master oscillator for providing said frequency reference to said transmitting/receiving unit and the subscriber equipment.

43. A base station apparatus as defined in claim 1 wherein said base unit is connected to said transmitting/receiving unit via one of at least one fiber optic link and at least one coaxial cable.

44. A base station apparatus as defined in claim 43 wherein a frequency of the communication signals transmitted between said base unit and said transmitting/receiving unit is different than a frequency of the communication signals transmitted between said transmitting/receiving unit and the subscriber equipment.

45. A base station apparatus as defined in claim 44 wherein said frequency of the communication signals transmitted between said base unit and said transmitting/receiving unit is in intermediate frequency, and said frequency of the communication signals transmitted between said transmitting/receiving unit and the subscriber equipment is in radio frequency.

46. A base station apparatus as defined in claim 1 wherein said base station is configured to receive the communication signals from and provide the communication signals to the subscriber equipment in a selected one of a synchronous continuous format and an asynchronous burst format.

47. Local multipoint distribution service base station apparatus for sending and receiving communication signals to and from a plurality of remotely located subscriber equipment, comprising:

a base unit including at least one rack, said rack configured to receive a plurality of subracks;

a plurality of communication signal generators arranged and configured to be received by each of said plurality of subracks, wherein each of said plurality of communication signal generators is implemented as a replaceable module each with a different functionality and a different physical structure, the replaceable modules being grouped together according to their respective functionalities, the replaceable modules operable to be removed and installed according to a desired subscriber capacity;

a transmitting/receiving unit operationally connected to said base unit for transmitting and receiving the communication signals to and from the subscriber equipment;

wherein said base station is configured to receive the communication signals from and provide the communication signals to the subscriber equipment in a selected one of a synchronous continuous format and an asynchronous burst format.

48. A local multipoint distribution service base station apparatus for sending and receiving communication signals to and from subscriber equipment, comprising:

a communication signal generator for generating the communication signals;

a transmitting/receiving unit operationally connected to said communication signal generator and configured to transmit/receive the communication signals to and from the subscriber equipment; and an antenna unit operatively connected to said transmitting/receiving unit for directing and receiving the communication signals to and from the subscriber equipment;

wherein said antenna unit and said transmitting/receiving unit are arranged and configured into an integrated assembly.

49. A base station apparatus as defined in claim 48 wherein said antenna unit includes a radome/polarizer and an antenna.

50. Local multipoint distribution service base station apparatus for sending and receiving communication signals to and from remotely located subscriber equipment, comprising:
- a base unit including at least one rack, said rack configured to receive at least one subrack;
- at least one communication signal generator arranged and configured to be received in said at least one subrack;
- a transmitting/receiving unit operationally connected to said base unit for transmitting and receiving the communication signals to and from the subscriber equipment; and
- an antenna unit operatively connected to said transmitting/receiving unit for directing and receiving the communication signals to and from the subscriber equipment;
- wherein said antenna unit and said transmitting/receiving unit are arranged and configured into an integrated assembly.

* * * * *